United States Patent
Chung et al.

(10) Patent No.: US 6,944,074 B2
(45) Date of Patent: Sep. 13, 2005

(54) SEMICONDUCTOR MEMORY DEVICE AND METHOD OF OPERATING THE SAME

(75) Inventors: Jin Yong Chung, Kyungki-Do (KR); Gug Seon Choi, Seoul (KR)

(73) Assignee: Hynix Semiconductor, Inc., Kyungki-Do (KR)

( * ) Notice: Subject to any disclaimer, the term of this patent is extended or adjusted under 35 U.S.C. 154(b) by 0 days.

(21) Appl. No.: 10/739,753

(22) Filed: Dec. 18, 2003

(65) Prior Publication Data

US 2004/0218431 A1 Nov. 4, 2004

(30) Foreign Application Priority Data

Apr. 30, 2003 (KR) .............................. 10-2003-0027678

(51) Int. Cl.[7] .............................................. G11C 29/00
(52) U.S. Cl. .................. 365/200; 365/230.03; 365/222
(58) Field of Search ........................ 356/200, 230.03, 356/222, 230.06, 189.07

(56) References Cited

U.S. PATENT DOCUMENTS

| | | | | |
|---|---|---|---|---|
| 5,586,075 A | * | 12/1996 | Miwa | .................... 365/185.29 |
| 5,712,821 A | | 1/1998 | Ryu et al. | |
| 5,920,515 A | * | 7/1999 | Shaik et al. | ................. 365/200 |
| 5,970,001 A | * | 10/1999 | Noda et al. | .................. 365/200 |
| 6,064,607 A | * | 5/2000 | Miki et al. | ................... 365/200 |
| 6,078,543 A | * | 6/2000 | Kim | ....................... 365/230.03 |
| 6,118,710 A | * | 9/2000 | Tsuji | .......................... 365/200 |

FOREIGN PATENT DOCUMENTS

JP  07-244997  9/1995

\* cited by examiner

Primary Examiner—Anh Phung
Assistant Examiner—Dang T Nguyen
(74) Attorney, Agent, or Firm—Marshall, Gerstein & Borun LLP

(57) ABSTRACT

A semiconductor memory device and method of operating the same that replaces a fail normal word line that is coupled to a fail memory cell with a redundant word line from a redundant memory block. If the fail normal word line is selected during operation, both the fail normal word line and the redundant word line are activated at the same time to increase capacitance at the sense amplifier. Therefore, it may be possible to increase the exactness of a read operation or a refresh operation, and thereby improve reliability of a device operation by increasing a comparison margin of the sense amplifier.

17 Claims, 2 Drawing Sheets

SEMICONDUCTOR MEMORY DEVICE AND METHOD OF OPERATING THE SAME

BACKGROUND

1. Techinical Field

The present disclosure relates to a semiconductor memory device and method of operating the same and, more particularly, to a semiconductor memory device and method of operating the same that can improve a refresh characteristic by replacing a fail word line with a redundant word line.

2. Discussion of Related Art

If even one of numerous cells is defective, the entire memory is classified as inferior and not used. As the level of integration of the memory is increased, the likelihood of a defect generated in a few cells is high. To classify an entire memory as inferior and not use it is an inefficient method that lowers yield. To solve this problem, redundant memory cells are provided with the memory. The defective or fail cell is replaced by the redundant memory cell when the failure takes place in the cell, thus improving the yield.

FIG. 1 shows a cell array structure of a semiconductor memory device having normal cells and redundant cells.

Referring to FIG. 1, the memory device includes a normal memory block NMB having a plurality of normal word lines (for example, 256 in number; NWL0 to NWL255 shown) for storing data, and a redundant memory block RMB having a plurality of redundant word lines (for example, 256 in number; RWL0 to RWL255 shown) for substituting fail normal word lines of the normal memory block NMB.

After such a memory device is fabricated, whether a fail cell has occurred is finally checked through a test. If there is a fail cell (for example, C100) of the memory cells included in the normal memory block NMB, the fuse of the fuse ROM array (not shown) included in the memory device is cut to store address information (hereinafter referred to as 'fail address') on a normal word line NWL0 to which the fail cell C100 is connected. Such address information on the fail normal word line NWL0 is compared with an external address (or internal address that is internally generated for a refresh operation) externally inputted every time when the memory device is operated. As a result of the comparison, if the fail address and the external address (or the internal address) are not coincident, it means that the normal word line (for example, one of NWL1 to NWL255) does not have any fail cell. Therefore, a corresponding normal word line is selected and driven. If the fail address and the external address (or the internal address) are coincident, it means that the normal word line NWL0 has a fail cell. Accordingly, a signal inputted to the corresponding normal word line NWL0 is applied to the redundant word line (for example, RWL0) of the redundant memory block RMB, thus driving the redundant word line RWL0.

In the case of a memory cell having a single transistor and a single capacitor, charges may be stored at the capacitor. To increase the level of integration, the size of the capacitor may be decreased, thereby increasing the amount of time charges stored at the capacitor are discharged. Thus, difficulty may exist in maintaining data for an extended period of time. To maintain data stored at the memory cell for a long period of time, the memory cell performs a refresh operation for restoring data stored at the memory cell.

To read data stored at the memory cell, as well as during a refresh operation, the normal word line NWL0 to which the corresponding memory cell (for example, C100) is connected is selected, and a voltage is detected through a bit line connected to the memory cell C100. If the memory cell C100 is a defective or fail memory cell, as discussed above, the redundant word line RWL0 is selected instead of the normal word line NWL0, and data stored at the memory cell C110 connected to the redundant word line RWL0 are read therefrom. To read data stored at the memory cell C100 connected to the redundant word line RWL0, a sense amplifier BLSA1 compares the voltage detected through a bit line BL1 and a reference. voltage (generally, Vcc/2) applied to an inverse bit line BL1#.

If a charge of '0' is stored at the capacitor of the memory cell C110, data can be maintained stably in the memory cell since there are no charges to be discharged. Further, because the difference in the voltages between the bit line BL1 of 0 v and the inverse bit line BL1# of Vcc/2 during a refresh or read operation is clearly distinguished, a read error rarely takes place. If a charge of '1' is stored at the capacitor of the memory cell C110, however, it may be impossible to maintain the data in the memory cell stably since the charges are discharged as time elapses. Therefore, during a refresh or read operation, the sense amplifier BLSA1 may detect the difference in the voltages ($\alpha$) between the bit line BL1 and the inverse bit line BL1# to be about $\alpha$+Vcc/2 lower than Vcc due to the discharge and the reference voltage applied to the inverse bit line BL1# of Vcc/2. As a result of the comparison, if the difference in the voltages ($\alpha$) is not high, a read error may occur.

As the level of integration increases, the capacitance of the capacitor may decrease, thereby increasing the speed that the charges stored at the capacitor are discharged. Therefore, even if a fail word line is replaced with a redundant word line, it is not guaranteed that data stored in the memory cell can be maintained stably. Furthermore, it may become more difficult for the sense amplifier to detect the difference in the voltages between the bit line and the inverse bit line. Therefore, the probability that a read error may occur is increased, thereby lowering the reliability of the device.

SUMMARY

The present disclosure is directed to a semiconductor memory device and method of operating the same, that can increase the exactness of a read operation or a refresh operation, and improve the reliability of a device operation, by increasing a comparison margin of a sense amplifier. Specifically, after a redundant word line replaces a fail normal word line, both the fail normal word line and the redundant word line are activated at the same time to increase the capacitance at the sense amplifier if the fail normal word line is selected when the device is operated.

According to one embodiment, a semiconductor memory device includes a normal word line block having a plurality of normal word lines, each of the plurality of normal word lines being connected to a memory cell, a redundant word line block having a plurality of redundant word lines, each of the plurality of redundant word lines being configured to replace a fail normal word line connected to a fail memory cell, and a decoder configured to select one of the plurality of normal word lines according to an address signal, wherein the decoder is configured to select both the fail normal word line and the redundant word line at the same time, if the fail normal word line is selected.

In the semiconductor memory device according to one embodiment, the decoder may include an X-address predecoder configured to select a normal word line located in the normal word line block or a redundant word line located in the redundant word line block according to the address signal; a row decoder and word line driver configured to select the normal word line from the memory block according to the address signal regardless of whether the fail normal word line connected to a fail memory cell has been selected or not; and a redundant row decoder and word line driver configured to select a redundant word line that corresponds to the fail normal word line if the fail normal word line is selected.

The semiconductor memory device according to one embodiment may further include a bit line sense amplifier configured to read data stored at the normal memory cell connected to the normal word line or the redundant memory cell connected to the redundant word line. When a fail normal word line is selected, data stored at both the fail memory cell and the redundant memory cell are read by the bit line sense amplifier since the fail memory cell and the redundant memory cell are connected in parallel to one input terminal of the bit line sense amplifier.

In the semiconductor memory device according to one embodiment, each of the normal memory cell and the redundant memory cell may include a transistor having a gate connected to a normal word line and a redundant word line, respectively, and a drain connected to a bit line. A capacitor may be connected between a source of the transistor and ground.

The semiconductor memory device according to one embodiment may further include a repair address information storage unit configured to store address. information associated with the fail normal word line to be repaired. The repair address information storage unit may include a fuse ROM array having a plurality of fuse ROMs.

The semiconductor memory device according to one embodiment may further include a comparator configured to compare an address signal and the address information associated with the fail normal word line, and generate a redundant word line enable signal when the address signal and the address information are the same. Therefore, the decoder may select the redundant word line along with the fail normal word line.

In the semiconductor memory device according to one embodiment, the address signal may be an external address inputted externally or an internal address generated by a refresh counter during a refresh operation.

According to one aspect of the present disclosure, a method of operating a semiconductor memory device includes providing a plurality of normal word lines, each of the plurality of normal word lines being connected to a normal memory cell on which data are stored; providing a plurality of redundant word lines, each of the plurality of redundant word lines being configured to replace a fail normal word line to which a fail memory cell is connected; storing address information associated with the fail normal word line; inputting an address signal; comparing the address signal and the address information associated with the fail normal word line; if the address signal and the address information are not the same, reading or refreshing the data stored at the normal memory cell connected to the normal word line according to the address signal; and if the address signal and the address information are the same, reading or refreshing the data stored at both the fail memory cell connected to the fail normal word line and the redundant memory cell connected to the redundant word line according to the address signal using a single sense amplifier.

DETAILED DESCRIPTION

Figure 1:
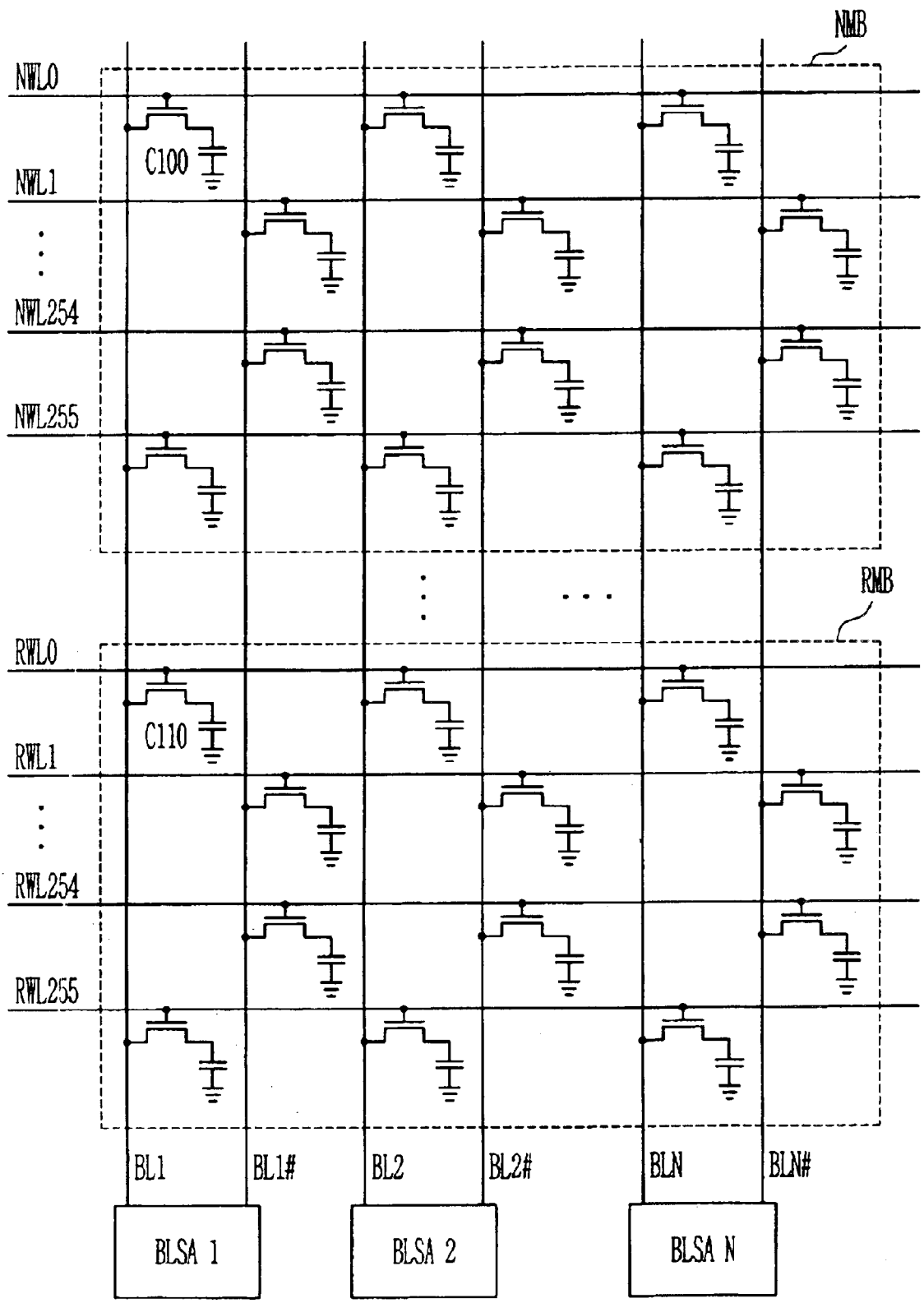
FIG. 1 shows a conventional cell array structure of a semiconductor memory device having normal cells and redundant cells.
Figure 2:
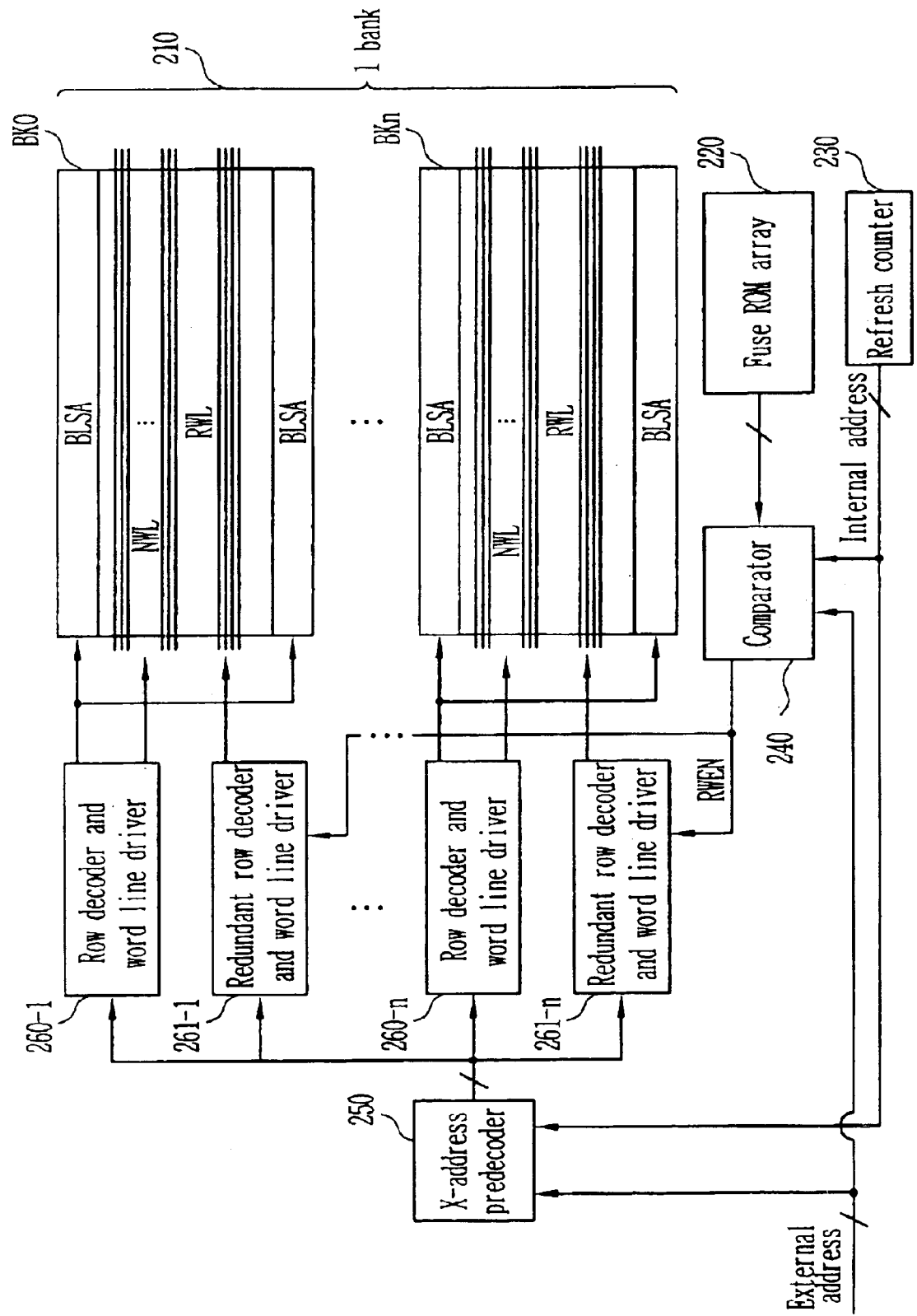
FIG. 2 is a block diagram illustrating a semiconductor memory device according to one embodiment.

FIG. 2 is a block diagram illustrating a semiconductor memory device according to one embodiment.

In general, as the level of integration of the memory increases, a merged bank architecture (MBA) has been widely used in which the memory is divided into four or more bank structures, with each of the banks sharing an X-address predecoder or a control block to optimize the chip area. For easy understanding, the bank structure will be described by way of an example. However, it is to be understood that the present disclosure is not restricted to the described bank structure.

Referring to FIG. 2, a core array 210 is a 1-bank structure having a plurality of memory blocks BK0 to BKn that are divided by two (upper and lower) bit line sense amplifiers BLSAs. Each of the memory blocks BK0 to BKn has both a plurality of normal word lines NWL and a plurality of redundant word lines RWL.

A fuse ROM array 220 includes a plurality of fuse ROMs (not shown), each of the plurality of fuse ROMs corresponding to one of the plurality of memory blocks BK0 to BKn. Address information associated with a fail normal word line NWL to be repaired is programmed into each fuse ROM. It should be understood that address information associated with the fail normal word line NWL to be repaired may be stored using an information storage unit other than the fuse ROM array 220.

A refresh counter 230 is configured to sequentially generate internal addresses during a refresh operation.

A comparator 240 is configured to compare an external address and the address information programmed into the fuse ROM array 220 during a normal operation and to compare the address information programmed into the fuse ROM array 220 and the internal address outputted by the refresh counter 230 during a refresh operation. As a result of the comparison, the comparator 240 activates a redundant word line enable signal (RWEN) if the two addresses are the same. In other words, if the fail normal word line NWL to which the fail memory cell is connected is selected during either a normal operation or a refresh operation, the comparator 240 activates the redundant word line enable signal (RWEN).

A decoder configured to select the word line may include an X-address predecoder 250, row decoder and word line drivers 260-1 to 260-n, and redundant row decoder and word line drivers 261-1 to 261-n.

The X-address predecoder 250 is configured to decode an external address (X-address) during a normal operation and is configured to decode an internal address outputted by the refresh counter 230 during a refresh operation to output an upper coding signal that is a memory block select signal and a lower coding signal that is a word line select signal. For example, in the case of a 16M dynamic random access memory (DRAM), the X-address predecoder 250 decodes addresses (A8 to A11) of external addresses (A0 to A11) inputted thereto to select one of the memory blocks BK0 to BKn. The addresses (A0 to A7) are used to select one of the 256 word lines within the one memory block selected by the addresses (A8 to A11).

The row decoder and word line drivers 260-1 to 260-n are configured to enable the bit line sense amplifier BLSA to select one of the memory blocks BK0 to BKn according to the upper coding signal outputted from the X-address predecoder 250. Furthermore, the row decoder and word line drivers 260-1 to 260-n are configured to select one of the normal word lines NWL within the block selected by the upper coding signal according to the lower. coding signal outputted from the X-address predecoder 250 without regard to whether a fail normal word line has been selected.

The redundant row decoder and word line drivers 261-1 to 261-n are driven by the redundant word line enable signal (RWEN) outputted from the comparator 240 to select one of the redundant word lines RWL within the redundant memory block according to the lower coding signal outputted from the X-address predecoder 250.

Currently, during a normal operation or a refresh operation, if a normal word line that is connected to a fail memory cell is selected, the comparator 240 activates only the redundant word line enable signal (RWEN) and not the normal word line enable signal (not shown) to operate only the redundant row decoder and word line driver (any one of 261-1 to 261-n ). In other words, the comparator 240 controls the operation of the row decoder and word line drivers 260-1 to 260-n depending on whether the fail normal word line has been selected so that the fail normal word line is not driven.

In the present embodiment, however, even if a normal word line that is connected to a fail memory cell is selected during a normal operation or a refresh operation, the row decoder and word line drivers 260-1 to 260-n do not stop operating, but instead operate along with the redundant row decoder and word line drivers 261-1 to 261-n.

For example, in a state where the normal word line enable signal that had been inputted to the row decoder and word line drivers 260-1 to 260-n is precluded in the comparator 240, if the row decoder and word line drivers 260-1 to 260-n consist of NOR gates, a Vss voltage is applied to the normal word line enable signal input terminal. If the row decoder and word line drivers 260-1 to 260-n consist of NAND gates, the Vcc voltage is applied to the normal word line enable signal input terminal. As the Vss voltage does not have any influence on the output signal of the NOR gate and the Vcc voltage does not have any influence upon the output signal of the NAND gate, the row decoder and word line drivers 260-1 to 260-n operate along with the redundant row decoder and word line drivers 261-1 to 261-n regardless of the normal word line enable signal of the comparator 240.

As described above, if the row decoder and word line drivers 260-1 to 260-n and the redundant row decoder and word line drivers 261-1 to 261-n operate at the same time, a normal word line (for example, NWL0) to which a fail memory cell (for example, C100) is connected and a redundant word line (for example; RWL0) for substituting the normal word line are selected at the same time, as shown in FIG. 2. As a result, as the fail memory cell C100 and the redundant memory cell C100 are connected in parallel to one of the input terminals of the bit line sense amplifier BLSA1, the capacitor of the fail memory cell and the capacitor of the redundant memory cell are also connected in parallel. Therefore, the capacitance at the input terminal of the bit line sense amplifier BLSA is increased. A comparison margin of the sense amplifier BLSA1 is thus increased to increase the exactness of a read operation or a refresh operation, and thereby improve reliability of the device operation.

1. Normal Operation

First, data are stored at the memory cell connected to the plurality of normal word lines, address information associated with the fail normal word line to which the fail memory cell is connected is stored, and the redundant word line for substituting the fail normal word line is specified.

Thereafter, if an external address is inputted, the X-address predecoder 250 decodes the external address (X-address) to output the upper coding signal and the lower coding signal. Further, the comparator 240 sequentially compares the inputted external address and the address information programmed into the fuse ROM array 220. As a result of the comparison, if the two addresses are the same, the comparator 240 activates the redundant word line enable signal (RWEN).

On the other hand, if the external address and the address information programmed into the fuse ROM array 220 are not the same, the redundant word line enable signal (RWEN) is not activated. Thus, the redundant row decoder and word line drivers 261-1 to 261-n do not operate but only the plurality of the row decoder and word line drivers 260-1 to 260-n normally operate. Each of the row decoder and word line drivers 260-1 to 260-n enables a corresponding bit line sense amplifier BLSA according to the upper coding signal outputted from the X-address predecoder 250 to select one of the plurality of memory blocks BK0 to BKn (for example, memory block BK0). At the same time, the row decoder and word line drivers 260-1 to 260-n select and drive one of the normal word lines NWL within the memory block BK0 according to the lower coding signal outputted from the X-address predecoder 250.

Meanwhile, if the external address and the address information programmed into the fuse ROM array 220 are the same, the comparator 240 activates the redundant word line enable signal (RWEN). Therefore, the redundant row decoder and word line driver 261-1 is enabled to operate. At the same time, the row decoder and word line driver 260-1 normally operates regardless of whether the external address and the address information programmed into the fuse ROM array 220 are the same or not. In other words, although a fail normal word line that is connected fail memory cell is selected, the row decoder and word line driver 260-1 normally operates. Therefore, the row decoder and word line driver 260-1 selects and drives the normal word lines NWL within the memory block BK0 according to the lower coding signal outputted from the X-address predecoder 250. In addition, the redundant row decoder and word line driver 261-1 selects and operates the redundant word lines RWL within the memory block BK0 according to the lower coding signal outputted from the X-address predecoder 250.

As described above, if the external address and the address information programmed into the fuse ROM array 220 are not the same, only the normal word lines NWL are driven. If the external address and the address information programmed into the fuse ROM array 220 are the same, however, the redundant word line enable signal (RWEN) is activated, and both the normal word lines NWL to which the fail memory cell is connected and the redundant word lines RWL are thus driven at the same time.

Through the above operation, if the fail memory cell and the redundant memory cell are connected in parallel to one of the input terminals of the bit line sense amplifier BLSA, the capacitor of the fail memory cell and the capacitor of the redundant memory cell are also connected in parallel. The capacitance at the input terminal of the bit line sense amplifier BLSA is increased accordingly. The comparison margin of the sense amplifier BLSA1 is thus increased to increase the exactness of a read operation or a refresh operation, and thereby improve reliability of the device operation.

2. Refresh Operation

The refresh counter 230 sequentially generates the internal addresses, according to the refresh command, and provides them to the comparator 240. The X-address predecoder 250 decodes the internal addresses outputted from the refresh counter 230 and outputs the upper coding signal and the lower coding signal.

At this time, the comparator 240 sequentially compares the inputted internal addresses and the address information programmed into the fuse ROM array 220. As a result of the comparison, if the internal addresses and the address information programmed into the fuse ROM array 220 are the same, the comparator 240 activates the redundant word line enable signal (RWEN).

The X-address predecoder 250 decodes the internal address inputted from the refresh counter 230 to output the upper coding signal and the lower coding signal. The plurality of the row decoder and word line drivers 260-1 t 260-n select one of the plurality of the memory blocks BK0 to BKn according to the upper coding signal outputted from the X-address predecoder 250. The plurality of the row decoder and word line drivers 260-1 to 260-n sequentially operate the normal word lines NWL within the selected memory block according to the lower coding signal to perform the refresh operation.

In addition, the redundant row decoder and word line driver 261-1 is enabled by the redundant word line enable signal (RWEN) and thus drives the redundant word lines RWL within the selected memory block according to the lower coding signal outputted from the X-address predecoder 250 to perform the refresh operation.

In other words, if the internal address and the address information programmed into the fuse ROM array 220 are not the same even upon the refresh operation, only the row decoder and word line driver 260-1 drives the normal word lines NWL to perform the refresh operation. If, however, the two addresses are the same, the row decoder and word line driver 260-1 drives the normal word lines NWL and the redundant row decoder and word line driver 261-1 drives the redundant word lines RWL according to the redundant word line enable signal (RWEN), to perform the refresh operation.

As in the above, the method of driving the normal word line and the redundant word line at the same time can be applied even when the normal word line and the redundant word line do not exist within the same memory block. In other words, since the normal word line and the redundant word line are selected by different decoders, it is only necessary to drive the decoder that selects the normal word line and the decoder that selects the redundant word line.

According to the present disclosure, if a normal word line that is connected to a fail memory cell is selected, both a normal word line and a redundant word line for substituting the normal word line are driven at the same time to the increase capacitance at a sense amplifier. Therefore, it is possible to increase a comparison margin of the sense amplifier. As a result, the exactness of a read operation or a refresh operation is increased, thereby improving reliability of a device operation.

Although the foregoing description has been made with reference to the disclosed embodiment, it is to be understood that changes and modifications to the present disclosure may be made by one of ordinary skill in the art without departing from the spirit and scope of the present disclosure and the appended claims.

What is claimed is:

1. A semiconductor memory device comprising:
   a normal word line block including a plurality of normal word lines, each of the plurality of normal word lines being coupled to a normal memory cell;
   a redundant word line block including a plurality of redundant word lines, each of the plurality of redundant word lines being coupled to a redundant memory cell and configured to replace a fail normal word line of the plurality of normal word lines, the fail normal word line being coupled to a fail memory cell;
   a comparator configured to compare a first address and a second address associated with the fail normal word line coupled to the fail memory cell, and generate a redundant word line enable signal if the first address and the second address are the same;
   a row decoder and word line driver coupled to the normal word line block, the row decoder and word line driver being configured to select a normal word line from the plurality of normal word lines according to the first address; and
   a redundant row decoder and word line driver coupled to the redundant word line block and the comparator, the redundant row decoder and word line driver being configured to select a redundant word line corresponding to the first address based on the redundant word line enable signal,
   wherein when the first address and the second address are the same during a refresh operation and a normal operation, the fail normal word line is selected by the row decoder and word line driver at the same time as the redundant word line is selected by the redundant row decoder and word line driver.

2. The semiconductor memory device of claim 1, further comprising:
   a predecoder coupled to the row decoder and word line driver and the redundant row decoder and word line driver, the predecoder configured to select a memory block from the normal word line block or the redundant word line block based on the first address.

3. The semiconductor memory device of claim 1, wherein the first address is an external address inputted externally or an internal address generated by a refresh counter during the refresh operation.

4. The semiconductor memory device of claim 1, further comprising a bit line sense amplifier coupled to the normal word line block and the redundant word line block, the fail memory cell of the fail normal word line and the redundant memory cell of the redundant word line being coupled in parallel to an input terminal of the bit line sense amplifier, wherein data stored at both the fail memory cell of the fail normal word line and the redundant memory cell of the redundant word line are read by the bit line sense amplifier when the fail normal word line is selected.

5. The semiconductor memory device of claim 1, wherein the normal memory cell comprises:
   a transistor having a gate coupled to the normal word line and a drain coupled to a bit line; and
   a capacitor coupled between a source of the transistor and ground.

6. The semiconductor memory device of claim 1, wherein the redundant memory cell comprises:
   a transistor having a gate coupled to the redundant word line and a dram coupled to a bit line; and
   a capacitor coupled between a source of the transistor and ground.

7. The semiconductor memory device of claim 1, further comprising a repair address information storage unit configured to store the second address associated with the fail normal word line to be repaired.

8. The semiconductor memory device of claim 7, wherein the repair address information storage unit comprises a fuse read only memory (ROM) array having a plurality of fuse ROMs.

9. A method of operating a semiconductor memory device, comprising:

providing a plurality of normal word lines, each of the plurality of normal word lines being coupled to a normal memory cell;

providing a plurality of redundant word lines, each of the plurality of redundant word lines being coupled to a redundant memory cell and configured to replace a fail normal word line coupled to a fail memory cell;

storing a first address associated with the fail normal word line;

inputting a second address;

comparing the first address and the second address;

reading data stored at the normal memory cell coupled to one of the plurality of normal word lines during a normal operation if the first address and the second address are different;

refreshing data stored at the normal memory cell coupled to one of the plurality of normal word lines during a refresh operation if the first address and the second address are different;

reading data stored at both the fail memory cell coupled to the fail normal word line and the redundant memory cell coupled to one of the plurality of redundant word lines in a single sense amplifier during the normal operation if the first address and the second address are the same; and refreshing data stored at both the fail memory cell coupled to the fail normal word line and the redundant memory cell coupled to one of the plurality of redundant word lines in the single sense amplifier during the refresh operation if the first address and the second address are the same.

10. A semiconductor memory device comprising:

a normal word line block including a plurality of normal word lines, each of the plurality of normal word lines being coupled to a normal memory cell;

a redundant word line block including a plurality of redundant word lines, each of the plurality of redundant word lines being coupled to a redundant memory cell and configured to replace a fail normal word line of the plurality of normal word lines, the fail normal word line being coupled to a fail memory cell;

a comparator configured to compare a first address and a second address associated with the fail normal word line coupled to the fail memory cell, and generate a redundant word line enable signal if the first address and the second address are the same;

a row decoder and word line driver coupled to the normal word line block, the row decoder and word line driver being configured to select a normal word line from the plurality of normal word lines according to the first address; and a redundant row decoder and word line driver coupled to the redundant word line block and the comparator, the redundant row decoder and word line driver being configured to select a redundant word line corresponding to the first address based on the redundant word line enable signal, wherein when the first address and the second address are the same during a normal operation, both the fail normal word line and the redundant word line are selected at the same time.

11. The semiconductor memory device of claim 10, further comprising:

a predecoder coupled to the row decoder and word line driver, and the redundant row decoder and word line driver, the predecoder configured to select a memory block from the normal word line block or the redundant word line block according to the first address.

12. The semiconductor memory device of 10, wherein the first address is an external address inputted externally.

13. The semiconductor memory device of claim 10, further comprising a bit line sense amplifier coupled to the normal word line block and the redundant word line block, the fail memory cell of the fail normal word line and the redundant memory cell of the redundant word line being coupled in parallel to an input terminal of the bit line sense amplifier, wherein data stored at both the fail memory cell of the fail normal word line and the redundant memory cell of the redundant word line are read by the bit line sense amplifier when the fail normal word line is selected.

14. The semiconductor memory device of claim 10, wherein the normal memory cell comprises:

a transistor having a gate coupled to the normal word line and a drain coupled to a bit line; and a capacitor coupled between a source of the transistor and ground.

15. The semiconductor memory device of claim 10, wherein the redundant memory cell comprises:

a transistor having a gate coupled to the redundant word line and a drain coupled to a bit line; and a capacitor coupled between a source of the transistor and ground.

16. The semiconductor memory device of claim 10, further comprising a repair address information storage unit configured to store the second address associated with the fail normal word line to be repaired.

17. The semiconductor memory device of claim 16, wherein the repair address information storage unit comprises a fuse read only memory (ROM) array having a plurality of fuse ROMs.

* * * * *

UNITED STATES PATENT AND TRADEMARK OFFICE
CERTIFICATE OF CORRECTION

PATENT NO. : 6,944,074 B2
DATED : September 13, 2005
INVENTOR(S) : Jin Y. Chung et al.

It is certified that error appears in the above-identified patent and that said Letters Patent is hereby corrected as shown below:

Title page,
Item [73], Assignee, delete "Hynix Semiconductor, Inc." and insert
-- Hynix Semiconductor Inc. --.

Column 8,
Line 64, delete "dram" and insert -- drain --.

Signed and Sealed this

Fourteenth Day of March, 2006

JON W. DUDAS
*Director of the United States Patent and Trademark Office*